United States Patent [19]

Matsumura

[11] 4,319,195
[45] Mar. 9, 1982

[54] DEMODULATOR FOR AMPLITUDE MODULATED SIGNAL HAVING HIGH INPUT IMPEDANCE

[75] Inventor: Eiichi Matsumura, Tokyo, Japan

[73] Assignee: Nippon Electric Co., Ltd., Tokyo, Japan

[21] Appl. No.: 83,709

[22] Filed: Oct. 11, 1979

[30] Foreign Application Priority Data

Oct. 11, 1978 [JP] Japan ............................. 53-125576

[51] Int. Cl.³ ............................................. H03D 1/18
[52] U.S. Cl. .................................... 329/101; 329/166; 329/204; 455/337
[58] Field of Search ................ 455/337; 329/101, 164, 329/166, 168, 169, 204

[56] References Cited

U.S. PATENT DOCUMENTS 3,965,435 6/1976 Kriedt et al. ..................... 329/101

Primary Examiner—Siegfried H. Grimm
Assistant Examiner—Edward P. Westin
Attorney, Agent, or Firm—Sughrue, Mion, Zinn, Macpeak & Seas

[57] ABSTRACT

A demodulator for demodulating an amplitude modulated signal of a carrier signal. The demodulator provides a high output and is suitable for use in integrated circuitry. An input signal is connected to the base of one transistor of a pair of transistors forming an input differential amplifier. The input differential amplifier is stably biased by means of a constant current generator, diodes, input resistors and collector resistors. The two opposite phase output voltages from the differential amplifier are applied to the bases of a pair of transistors which have their collectors and emitters tied together. The output from the latter transistor pair is taken from the common emitter connection and it is applied directly to the base of an emitter follower transistor, the output from the latter constituting an output from the demodulator circuitry. The particular circuit arrangement provides significant elimination of the carrier frequency and provides filtering by parasitic capacitances of the transistors.

10 Claims, 4 Drawing Figures 4,319,195

DEMODULATOR FOR AMPLITUDE MODULATED SIGNAL HAVING HIGH INPUT IMPEDANCE

BACKGROUND OF THE INVENTION

This invention relates to a demodulator for an amplitude modulated signal (hereinafter referred to an AM signal).

The conventional demodulator for an AM signal having a high input impedance comprises an emitter-follower transistor biased as a class B or C amplifier. An input AM signal is applied to the base of the transistor and an output is derived from the emitter thereof. Such demodulator, however, is a half-wave rectifier, and thus has a low demodulating gain. Further, in order to attain an adjustment-free intermediate frequency (IF) amplifier in a radio receiver, it has been suggested to replace IF transformers by ceramic filters. However, the ceramic filter has an extremely high output impedance, so that an input voltage applied to the demodulator decreases, resulting in a small demodulated output.

SUMMARY OF THE INVENTION

It is therefore a major object of the present invention to provide a demodulator which can afford a sufficiently high demodulating gain even in the case where an input signal source impedance is high and which is suitable for fabrication as a semiconductor integrated circuit.

According to one feature of the present invention, there is provided a demodulator circuit comprising a differential amplifier for receiving an input amplitude modulated signal and deriving two intermediate output signals having different phases with each other, a first transistor having a base for receiving one of the intermediate output signals, a second transistor having a base for receiving the other intermediate output signal, emitters of the first and second transistors being connected in common, and an emitter-following transistor having a base coupled to the commonly connected emitters of the first and second transistors and an emitter coupled to an output terminal.

Since the demodulator of the present invention receives the input AM signal at the differential amplifier, the input impedance is high. Thus, even in the case where an input signal source has a high impedance, a sufficiently high input signal voltage can be supplied to the demodulator. The first and second transistors operate as a full-wave rectifier, and the demodulated signal therefrom is supplied to the emitter-follower transistor having a high input impedance. Therefore, the output demodulated signal obtained at the emitter of the emitter-follower transistor is sufficiently large. Further, since the emitter-follower transistor has a high input impedance, the carrier component of the input AM signal can be sufficiently decreased by a small capacitance such as a stray capacitance due to the transistors $Q_4$, $Q_5$ $Q_6$, so that no capacitor or a small capacitor is necessary. Thus, the demodulator of the present invention can be said to be a suitable circuit for a semiconductor integrated circuit.

BRIEF DESCRIPTION OF THE DRAWINGS

The above-mentioned and other objects, features, and advantages of the present invention will become more apparent by reference to the following description of preferred embodiments thereof taken in conjunction with the accompanying drawings, wherein.

DETAILED DESCRIPTION OF THE PREFERRED EMBODIMENTS

Figure 1:
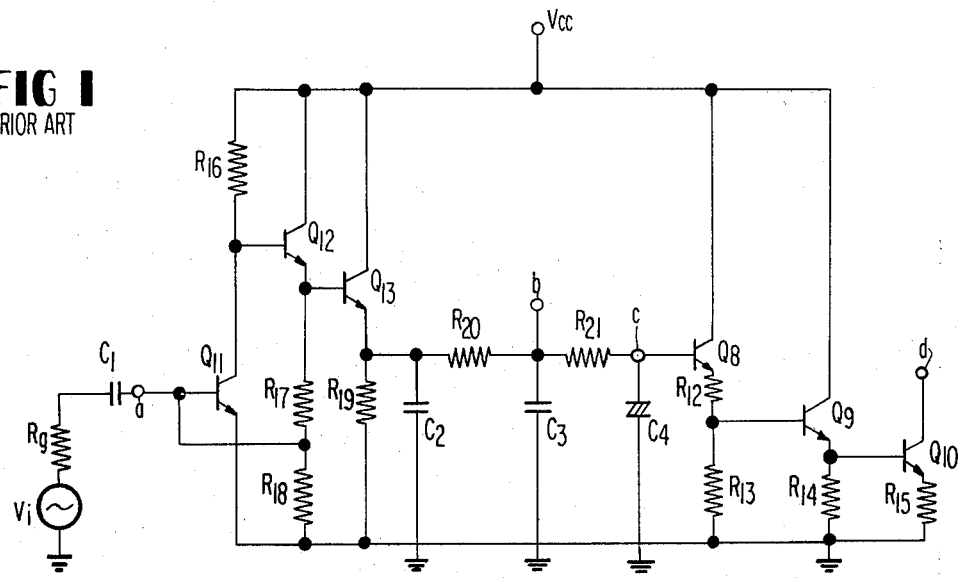
FIG. 1 is a circuit diagram showing a demodulator circuit in the prior art.

Referring now to FIG. 1 showing an AM demodulator in the prior art, an input AM signal applied to an input terminal a from an input signal source represented by a series connection of an AM signal voltage source $V_i$ and a signal source impedance $R_g$ through a coupling capacitor $C_1$, is amplified by a transistor $Q_{11}$. An output obtained across load resistor $R_{16}$ is transmitted to transistors $Q_{12}$ and $Q_{13}$ to be detected by the transistor $Q_{13}$. A signal obtained across an emitter resistor $R_{19}$ of the transistor $Q_{13}$ is derived as a demodulated signal from a terminal b through a filter consisting of a resistor $R_{20}$ and capacitors $C_2$ and $C_3$. An intermediate output obtained at the emitter of the transistor $Q_{12}$ is voltage-divided by means of resistors $R_{17}$ and $R_{18}$ and then negatively fed back to the base of the transistor $Q_{11}$. Moreover, the demodulated signal is smoothed by means of a resistor $R_{21}$ and a capacitor $C_4$, and thereby a D.C. voltage for effecting automatic gain control (thereinafter referred to AGC) is produced at a terminal c. An amplifier composed of transistors $Q_8$, $Q_9$ and $Q_{10}$ and resistors $R_{12}$, $R_{13}$, $R_{14}$ and $R_{15}$ is an AGC amplifier, and a terminal d is an output terminal of this AGC amplifier. The voltage at the terminal d is applied to amplifying stage prior to the input terminal a for controlling the gain of the prestage amplifier so as to derive an output of a constant level. The D.C. voltage at the terminal c when no input signal exists is determined by the voltage provided by resistances of the resistors $R_{17}$ and $R_{18}$ and base-emitter voltage of the transistor $Q_{11}$. This voltage at the terminal c takes a value proportional to the base-emitter voltage of the transistor $Q_{11}$, and varies in such direction so as to compensate the D.C. voltage at the terminal d which varies by the temperature variations in the base-emitter voltages of the transistors $Q_8$, $Q_9$ and $Q_{10}$. Thus, an AGC voltage is obtained which is not affected by the temperature variation.

However, the above-described AM demodulator of the prior art has the following disadvantage. Since the resistors $R_{17}$ and $R_{18}$ operate to negatively feed back the signal amplified by the transistor $Q_{11}$ to the base of the transistor $Q_{11}$, in addition to their operation of establishing a bias voltage, the amount of negative feedback is increased by high input signal source impedance $R_g$, and thus the gain of the amplifier composed of the transistor $Q_{11}$ is lowered. This results in lowering the demodulating gain and in deriving a small demodulated output. Further, in recent years, nonadjustment assembly of AM radio broadcast receivers is being advanced by making use of ceramic elements such as ceramic filters or the like in place of IF coils. If a ceramic filter is connected just before such a demodulator in the prior art, as an output impedance of a ceramic filter is as high as about 3 K$\Omega$, lowering of a gain is remarkable and a sharp selectibility performance of a ceramic filter deteriorates. Furthermore, since a large number of capacitors is required, the AM demodulator in the prior art does not have a circuit construction suited for a semiconductor integrated circuit.

Figure 2:
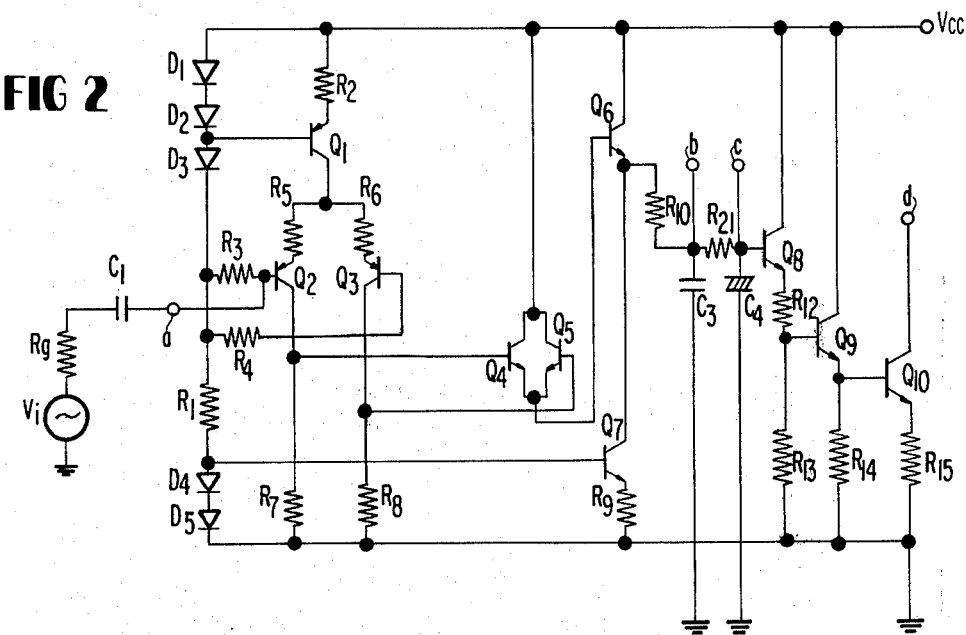
FIG. 2 is a circuit diagram showing a demodulator circuit according to one preferred embodiment of the present invention.

Turning now to FIG. 2 of the drawings, there is shown one preferred embodiment of the present invention. In this figure, component elements having the same functions as those illustrated in FIG. 1 are given like reference numerals. A differential amplifier composed of transistors $Q_2$ and $Q_3$ and resistors $R_5(220\Omega)$, $R_6(220\Omega)$, $R_7(9\ K\Omega)$ and $R_8(9\ K\Omega)$ is driven by a constant current source consisting of diodes $D_1$ to $D_3$, a transistor $Q_1$ and a resistor $R_2$ of $680\Omega$. Base bias voltages for the transistors $Q_2$ and $Q_3$ are applied from a series circuit of a resistor $R_1$ and diodes $D_1$ to $D_5$ via resistors $R_3(2.7\ K\Omega)$ and $R_4(2.7\ K\Omega)$, respectively. The input impedance of the differential amplifier can be raised by use of resistors $R_3$ and $R_4$ of high resistances. An input signal is applied through a capacitor $C_1$ to the base of the transistor $Q_2$ forming the differential amplifier, whose output signals are applied respectively from one ends of the load resistors $R_7$ and $R_8$ to bases of transistors $Q_4$ and $Q_5$ to be subjected to AM-demodulation by these transistors, then the demodulated output signal is applied to the base of transistor $Q_6$. The output at the emitter of the transistor $Q_6$ is passed through a low-pass filter consisting of a resistor $R_{10}$ of 3 K$\Omega$ and a capacitor $C_3$ of $0.022\mu$ F. and derived at the terminal b as a demodulated signal. The transistors $Q_4$ and $Q_5$ are biased in class B or C to operate as rectifiers by the resistors $R_7$ and $R_8$ and the emitter follower transistor $Q_6$. An emitter load for the transistor $Q_6$ is provided by a constant-current load consisting of a transistor $Q_7$ and a resistor $R_9$ of 3 K$\Omega$. The high input impedance of the emitter followed transistor $Q_6$ and stray capacitances of the transistors $Q_4$, $Q_5$ and $Q_6$ form a smoothing circuit for carrier component of the AM input signal.

The output demodulated signal at the terminal b is further passed through a smoothing circuit of resistor $R_{21}$ (9 K$\Omega$) and capacitor $C_4$ (3.3$\mu$ F.) to form an AGC voltage at the terminal c. The AGC voltage at the terminal c is amplified by a circuit of transistors $Q_8$, $Q_9$ and $Q_{10}$ and resistors $R_{12}(470\Omega)$, $R_{13}(1.6\ K\Omega)$, $R_{14}(5\ K\Omega)$ and $R_{15}(200\Omega)$, and derived from the terminal d to control the gain of the amplifier in stages prior to the demodulator.

An AGC voltage appearing at the terminal c when no input signal exists is equal to the difference voltage of the voltage across the resistor $R_7$ (or $R_8$) minus the base-emitter voltages of the transistors $Q_4$ (or $Q_5$) and $Q_6$. Since the voltage across the resistor $R_7$ (or $R_8$) is determined by the supply current of the constant current source formed by the transistor $Q_1$, the diodes $D_1$ and $D_2$ and the resistor $R_2$, the voltage across the resistor $R_7$ (or $R_8$) is proportional to a forward voltage across the diode $D_1$. Normally, in the case of producing a circuit in a semiconductor integrated circuit form, a diode is constructed as a collector-base short-circuited transistor, the voltage across the resistor $R_7$ is proportional to the base-emitter voltages of the transistors contained in the integrated circuit. Accordingly, the AGC voltage appearing at the terminal c would vary in such direction as being compensated against temperature changes of base-emitter voltages of transistors $Q_8$, $Q_9$ and $Q_{10}$ of the AGC amplifier, and the output AGC voltage at the terminal d has a constant D.C. voltage irrespective of temperature variation.

Since the input impedance of the differential amplifier of transistors $Q_2$ and $Q_3$ is high, and since this can be heightened increasing the resistances of the resistors $R_3$ and $R_4$, the input signal voltage is not lowered at the input terminal a by high impedance of the input signal source. Even if an input AM signal is applied to the input terminal a through a ceramic filter, the lowering of the input signal voltage and the lowering of the demodulating gain can be reduced to a minimum by designing adequately the resistances of the resistors $R_3$ and $R_4$.

In addition, since the transistors $Q_4$ and $Q_5$ achieve a rectifying effect such that they are alternately made to conduct in response to the output signals of the transistors $Q_2$ and $Q_3$ and their output signal is smoothed by parasitic capacitances accompanied with the emitters of the transistors $Q_4$ and $Q_5$ and the high input impedance of the emitter follower transistor $Q_6$, the carrier component contained in the demodulated output is of extremely small value. The capacitor for smoothing the carrier component requires small capacitance and it is sufficient to use the parasitic capacitors associated with the emitters of the transistors $Q_4$ and $Q_5$ and the base of the transistor $Q_6$. This results in elimination of capacitor $C_2$ required in the demodulator of FIG. 1, and in a circuit suited for a semiconductor integrated circuit. Moreover, in the case where the demodulator of FIG. 2 is employed in a radio-receiver, since the power of the carrier component of the IF frequency at the emitters of the transistors $Q_4$ and $Q_5$ is very small due to small value of stray capacitance and high input impedance of the transistor $Q_6$, radiation of the carrier component is small. The whistle interference produced by the interference between an input radio frequency signal and the radiated carrier component signal is very small.

Figure 3:
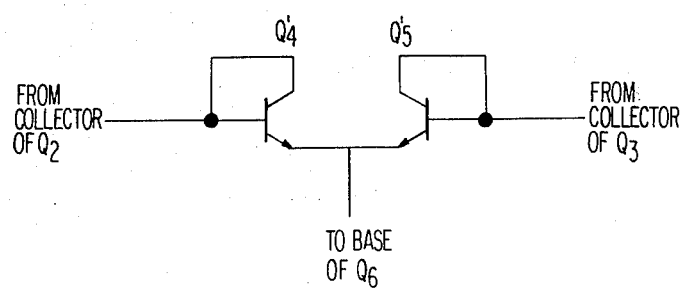
FIG. 3 is a circuit diagram of a modification of the demodulator circuit of FIG. 2.

It is to be noted that in the above-described preferred embodiment, obviously the same effect can be achieved if the polarities of all the transistors are reversed, or if only the transistors $Q_4$ and $Q_5$ are modified into the opposite polarity, then a negative detector circuit can be constructed. Furthermore, the same effects and advantages can be attained if the transistors $Q_4$ and $Q_5$ are modified into collector-base short-circuited diodes as shown in FIG. 3 as transistors $Q'_4$ and $Q'_5$.

Figure 4:
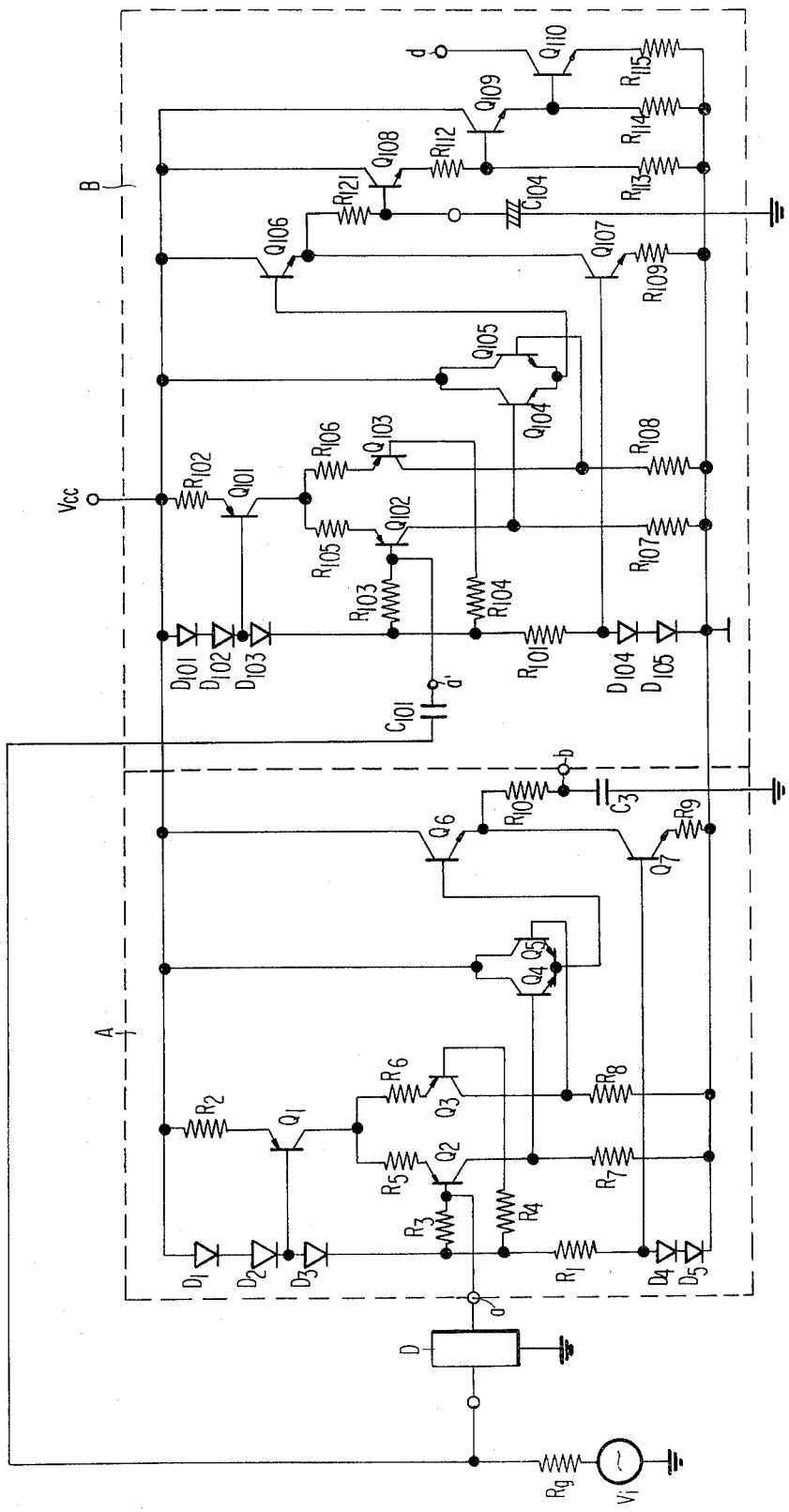
FIG. 4 is a circuit diagram showing a demodulator circuit according to another preferred embodiment of the present invention.

A detector circuit according to another preferred embodiment of the present invention is illustrated in FIG. 4. Component elements having the same of functions as those illustrated in FIG. 2 are given like reference numerals. In the circuit shown in FIG. 4, a circuit section A is an AM demodulator for deriving a normal demodulated signal, and this circuit section has the same construction as the part of the circuit shown in FIG. 2 to the left terminal b. A circuit section B is a circuit for deriving an AGC voltage, and this circuit section has the same circuit construction as that shown in FIG. 2 except that the resistor $R_{10}$ and the capacitor $C_3$ are eliminated. Transistors $Q_{101}$-$Q_{110}$, diodes $D_{101}$-$D_{105}$, resistors $R_{101}$-$R_{115}$ and capacitors $C_{101}$ and $C_{104}$ correspond to transistors $Q_1$-$Q_{10}$ diodes $D_1$-$D_5$, resistors $R_1$-$R_{15}$ and capacitors $C_1$ and $C_4$ in FIG. 2, respectively. An input signal generated from the input signal source having a signal source Vi and impedance Rg is applied to the input terminal a of the AM demodulator A through a ceramic filter D and to the input terminal a' through the capacitor $C_{101}$.

In this embodiment, the signal at the input terminal of the ceramic filter D is controlled to have a constant value by the AGC voltage at the terminal d of the circuit section B. Therefore, by constructing an AM radio broadcast receiver in the above-described manner, when the receiving frequency of the receiver is tuned to a frequency of a desired broadcast station by rotating a tuning dial, the modulated signal of the desired station can be easily and smoothly received. This is because the selectivity of the ceramic filter D is not deteriorated by AGC action.

As described above, according to the present invention, there is provided a demodulator, suitable for producing in an integrated circuit which has an extremely high input impedance, which has a high gain and which is provided with a small number of capacitors.

What is claimed is:

1. A demodulator comprising:
   an input terminal adapted to receive an amplitude modulated signal of a carrier signal;
   means for deriving two intermediate output signals in response to said amplitude modulated signal, said two intermediate output signals having different phases from each other;
   a first and a second transistor having their respective emitters connected in common, a base of said first transistor receiving one of said intermediate output signals, and a base of said second transistor receiving the other of said intermediate output signals;
   an emitter follower transistor having a base exclusively connected to the emitters of said first and said second transistors the total capacitance of the parasitic capacitors associated with the emitters of said first and second transistors and the base of said emitter follower transistor being of a value sufficient for smoothing said carrier signal; and
   an output terminal coupled to an emitter of said emitter follower transistor.

2. A demodulator claimed in claim 1, wherein said means for deriving two intermediate output signals includes a differential amplifier.

3. A demodulator claimed in claim 1 or 2, further comprising means for biasing said first and said second transistors into Class B or C operation.

4. A demodulator claimed in claim 1 or 2, wherein the collector of said first transistor is short-circuited to base thereof, and the collector of said second transistor is short-circuited to base thereof.

5. A demodulator claimed in claim 1 or 2, wherein collectors of said first and second transistors are connected in common.

6. A demodulator claimed in claim 3, wherein collectors of said first and second transistors are connected in common.

7. A demodulator claimed in claim 3, wherein the collector of the said first transistor is short-circuited to base thereof, and the collector of said second transistor is short-circuited to base thereof.

8. A demodulator claimed in claim 1, wherein the input impedance of said emitter follower transistor is primarily determined by an impedance component at said output end of said emitter follower transistor.

9. A demodulator comprising:
   an input terminal receiving an amplitude modulated signal of a carrier signal;
   a differential amplifier having an input end coupled to said input terminal; and a first and a second output end deriving, respectively, a first and a second intermediate signal, phases of said first and said second intermediate signal being in opposite relation;
   a first rectifying device having an input end receiving said first intermediate signal and an output end;
   a second rectifying device having an input end receiving said second intermediate signal and an output end;
   an emitter follower transistor having a base exclusively and directly connected to said output ends of said first and second rectifying devices, said carrier signal being smoothed by the parasitic capacitors of said first and second rectifying devices and said emitter follower transistor; and
   an output terminal coupled to an emitter of said emitter follower transistor.

10. A demodulator claimed in claim 9, wherein said first and said second rectifying devices are transistors, said input ends of said first and said second rectifying devices are bases of said transistors, and said output ends of said first and said second rectifying devices are emitters of said transistors.

* * * * *

UNITED STATES PATENT AND TRADEMARK OFFICE
CERTIFICATE OF CORRECTION

PATENT NO. : 4,319,195
DATED : March 9, 1982
INVENTOR(S) : Eiichi MATSUMURA

It is certified that error appears in the above—identified patent and that said Letters Patent is hereby corrected as shown below:

Column 1, line 60, change "Q4, Q5 Q6" to --$Q_4$, $Q_5$, $Q_6$--.

Column 2, line 34, change "(thereinafter referred to AGC)" to --(hereinafter referred to as AGC)--.

Column 3, line 38, change "followed" to --follower--.

Column 4, line 5, after "heightened", insert --by--.

Column 4, line 50, after "same", delete --of--.

Column 4, line 56, after "left", insert --of--.

Column 6, line 22, after "terminal", change ";" to --,--.

Signed and Sealed this

Fifteenth Day of June 1982

[SEAL]

Attest:

GERALD J. MOSSINGHOFF

Attesting Officer

Commissioner of Patents and Trademarks